(12) United States Patent
Tran et al.

(10) Patent No.: US 9,111,755 B1
(45) Date of Patent: Aug. 18, 2015

(54) BOND PAD AND PASSIVATION LAYER HAVING A GAP AND METHOD FOR FORMING

(71) Applicants: Tu-Anh N. Tran, Austin, TX (US); David B. Clegg, Austin, TX (US); Sohrab Safai, Austin, TX (US)

(72) Inventors: Tu-Anh N. Tran, Austin, TX (US); David B. Clegg, Austin, TX (US); Sohrab Safai, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/262,417

(22) Filed: Apr. 25, 2014

(51) Int. Cl.
*H01L 21/44* (2006.01)
*H01L 23/00* (2006.01)

(52) U.S. Cl.
CPC ............... *H01L 24/03* (2013.01); *H01L 24/43* (2013.01); *H01L 24/48* (2013.01); *H01L 2224/02245* (2013.01); *H01L 2224/85205* (2013.01)

(58) Field of Classification Search
CPC ............ H01L 21/48251; H01L 21/28079; H01L 21/02098; H01L 23/4951; H01L 23/49531; H01L 23/488; H01L 23/4821
USPC ......... 438/612, 613, 614, 617, 618, 637, 746, 438/786, 787, 791; 257/734, 772, 779, 784, 257/E21.006, E21.267, E21.278, E21.293, 257/E21.327, E21.347, E21.499, E21.508, 257/E21.509, 21.278
See application file for complete search history.

(56) References Cited

U.S. PATENT DOCUMENTS

| 5,235,212 A | 8/1993 | Shimizu et al. |
| 5,942,800 A | 8/1999 | Yiu et al. |
| 6,306,750 B1 | 10/2001 | Huang et al. |
| 6,596,628 B2 | 7/2003 | Magara |
| 6,835,898 B2 * | 12/2004 | Eldridge et al. ............... 174/267 |
| 8,394,713 B2 * | 3/2013 | Mathew ........................ 438/612 |
| 2003/0030153 A1 | 2/2003 | Perry |
| 2007/0102812 A1 | 5/2007 | Sun et al. |
| 2013/0001777 A1 | 1/2013 | Veychard et al. |

FOREIGN PATENT DOCUMENTS

EP 2339622 A1 6/2011

* cited by examiner

*Primary Examiner* — David Nhu

(57) ABSTRACT

A semiconductor device comprises an integrated circuit including a wire bond pad and a passivation material, and a first gap between a first selected portion of the wire bond pad and the passivation material. The first gap is positioned to contain at least a first portion of a splash of the wire bond pad formed during a wire bond process.

20 Claims, 10 Drawing Sheets

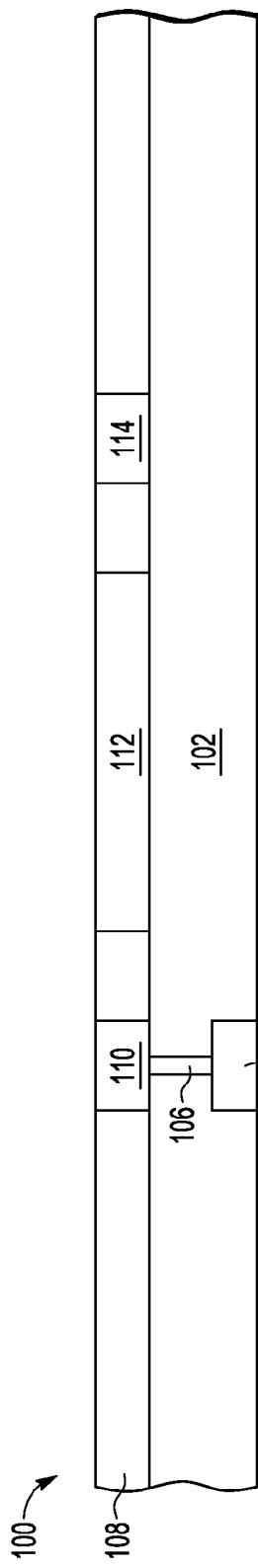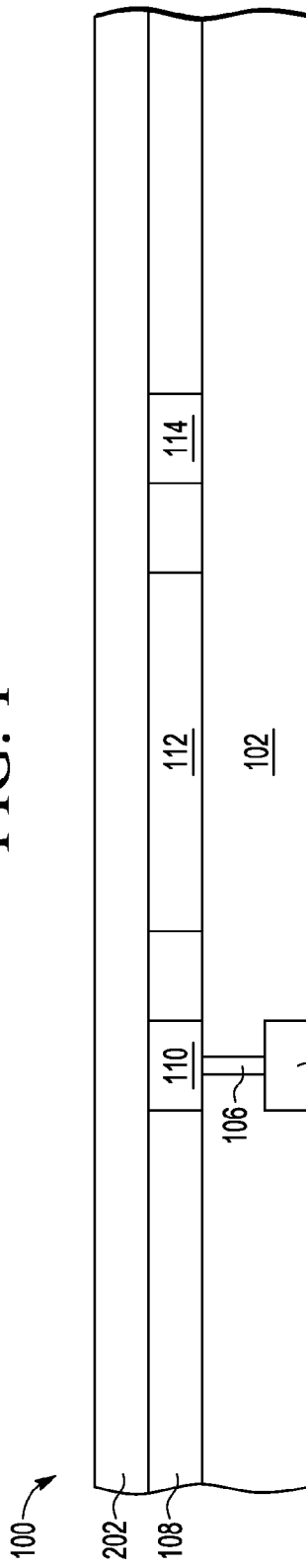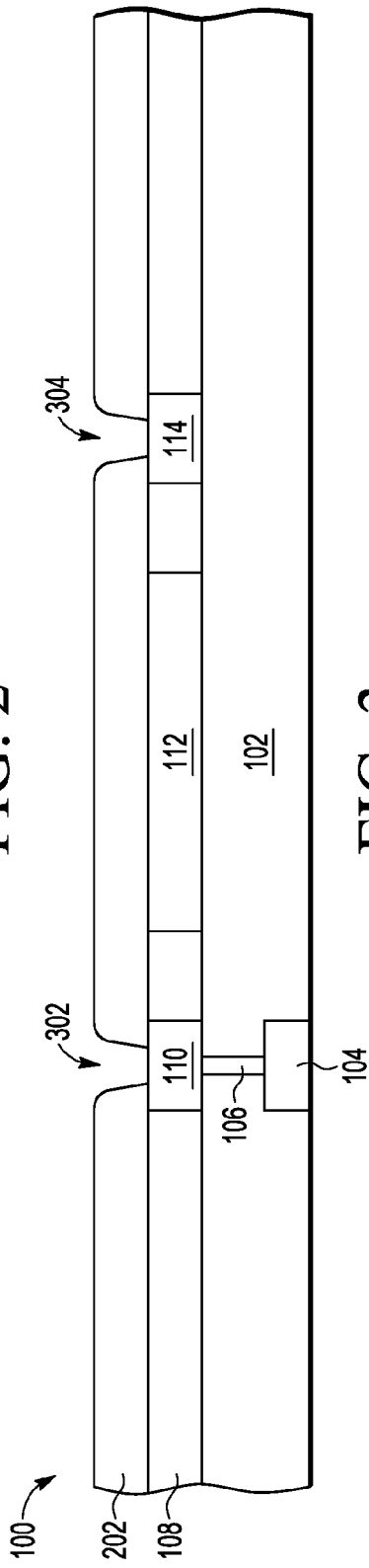

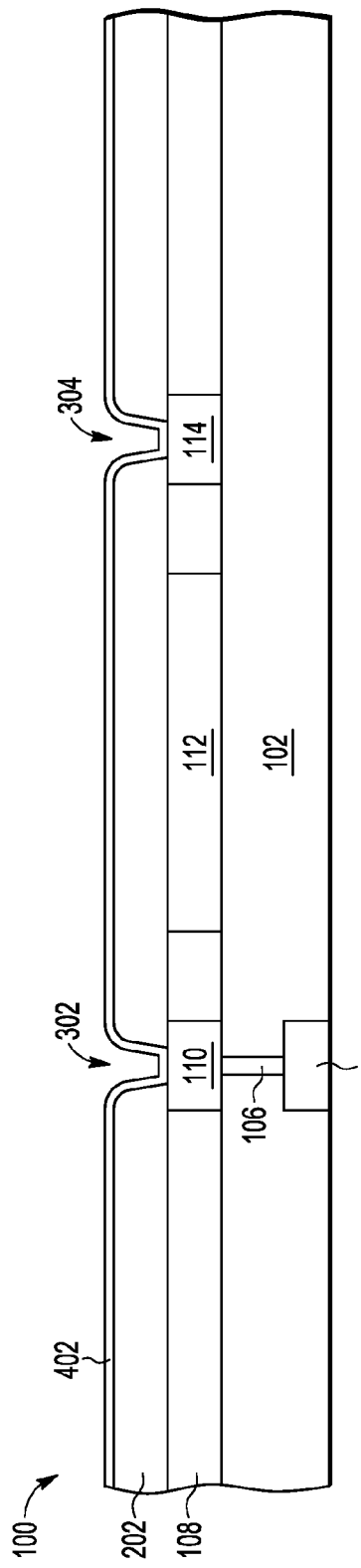
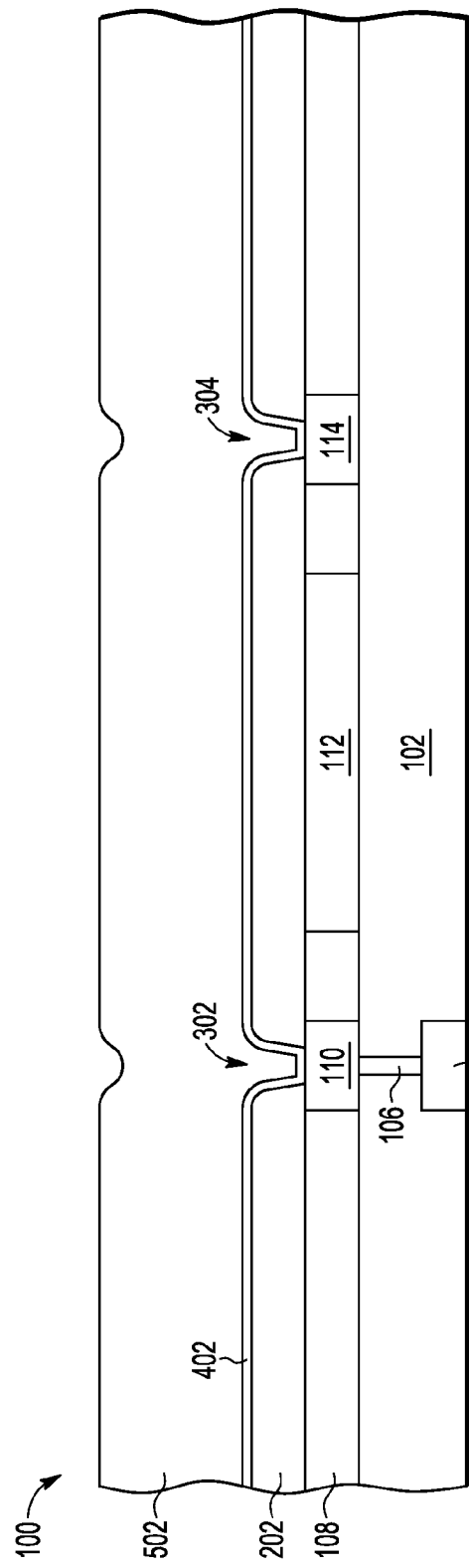

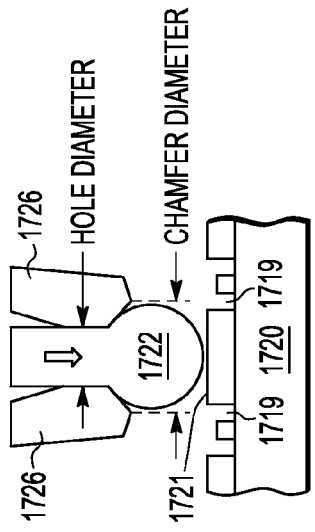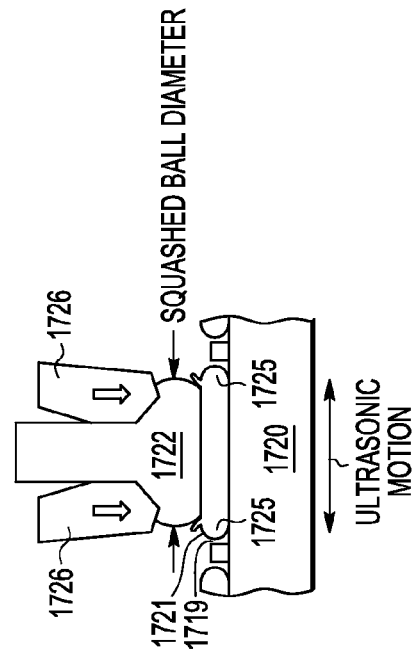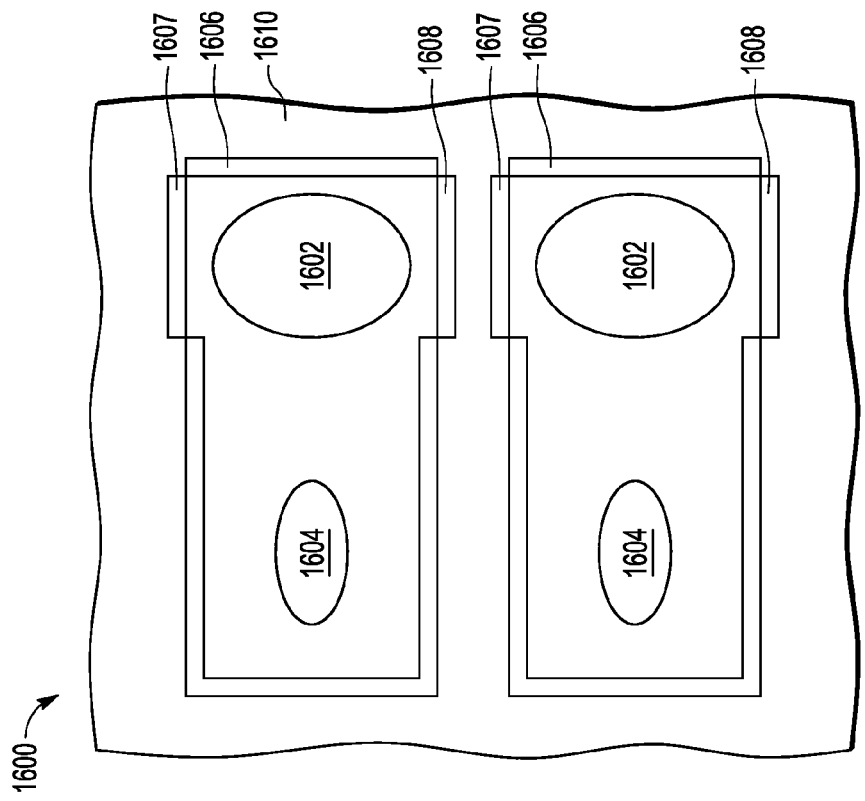

BOND PAD AND PASSIVATION LAYER HAVING A GAP AND METHOD FOR FORMING

BACKGROUND

1. Field

This disclosure relates generally to semiconductor processing, and more specifically, to forming a bond pad and a passivation layer with a gap alongside the bond pad to contain splash during wire bonding.

2. Related Art

Wire bonds provide electric connections to underlying circuitry within a semiconductor device. The ball bond of a wire bond is attached to a bond pad formed on the semiconductor device. For example, copper is commonly used for the wire bond and aluminum is commonly used as the bond pad. The bond pads of a semiconductor device are physically separated from each other, and the spaces between adjacent bond pads typically include passivation. However, during the bonding process, when the ball bond of the wire bond is attached to the aluminum bond pad, the aluminum pad deforms resulting in an aluminum splash which extends from under the ball bond. This aluminum splash may result in passivation cracking. The cracks in passivation may result in reliability failures of the semiconductor device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates a cross-sectional view of a semiconductor structure at a stage of processing in accordance with an embodiment of the present invention.

FIG. 2 illustrates a cross-sectional view of the semiconductor structure of FIG. 1 at a subsequent stage of processing in accordance with an embodiment of the present invention.

FIG. 3 illustrates a cross-sectional view of the semiconductor structure of FIG. 2 at a subsequent stage of processing in accordance with an embodiment of the present invention.

FIG. 4 illustrates a cross-sectional view of the semiconductor structure of FIG. 3 at a subsequent stage of processing in accordance with an embodiment of the present invention.

FIG. 5 illustrates a cross-sectional view of the semiconductor structure of FIG. 4 at a subsequent stage of processing in accordance with an embodiment of the present invention.

FIG. 16 illustrates a top-down view of a semiconductor structure in accordance with another embodiment of the present invention.

FIGS. 17-18 illustrate cross-sectional views of an example wire bonding sequence, in accordance with one embodiment of the present invention.

DETAILED DESCRIPTION

Figure 6:
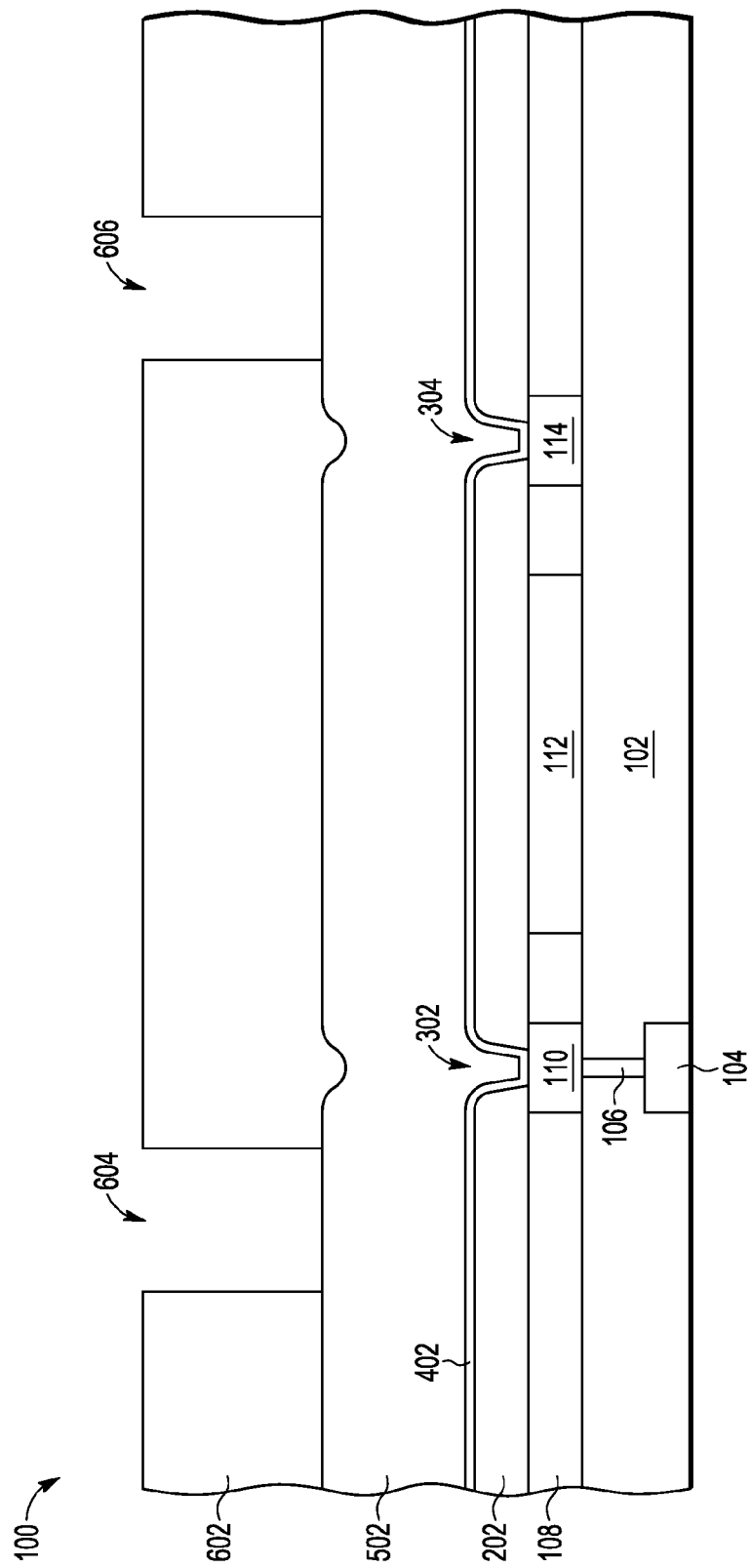
FIG. 6 illustrates a cross-sectional view of the semiconductor structure of FIG. 5 at a subsequent stage of processing in accordance with an embodiment of the present invention.

During wire bonding, a conductive splash forms when the ball bond of a wire bond is attached onto a bond pad of a semiconductor device. The majority of this conductive splash is typically formed in the direction of the ultrasonic vibration of the wire bonder's transducer. In one embodiment, a gap is formed in the bond pad and a passivation layer, the gap being is positioned and sized to contain at least a portion of the splash. This gap is formed by patterning the passivation layer so that an opening exists between a remaining portion of the passivation layer and the bond pads on either side. The gap provides space to accommodate the splash portions of the bond pad thereby eliminating problems associated with cracks in the passivation layer and/or splash portions that unintentionally spill over in contact with other conductive structures.

FIG. 1 illustrates, in a cross-sectional view, a semiconductor structure 100 (also referred to as an integrated circuit) which includes a last metal layer with conductive structures 110, 112, 114 formed within an interlayer dielectric layer (ILD) 108. The last metal layer corresponds to the last metal layer of the interconnect layers. Semiconductor structure 100 includes active circuitry 104 formed on and in a semiconductor substrate and having a plurality of interconnect layers formed over the active circuitry 104. Each interconnect layer may include interlayer conductive portions (e.g. to route signals within a layer) and intralayer conductive portions (e.g. to route signals between layers). Semiconductor structure 100 also includes a conductive via 106 which extends between conductive structure 110 and active circuitry 104. Conductive via 106, which corresponds to an interlayer conductive portion, may be considered as part of the last metal layer. Note that the interconnect layers provide electrical connections between the conductive structures of the last metal layer, such as conductive structures 110, 112, 114 to the underlying active circuitry 104.

FIG. 2 illustrates, in a cross-sectional view, semiconductor structure 100 after a passivation layer 202 is formed over the last metal layer (108-114). The passivation layer 202 may be formed of an organic glass, polymer, or other insulative material.

FIG. 3 illustrates, in a cross-sectional view, semiconductor structure 100 after passivation layer 202 is patterned to form openings 302, 304 which expose portions of underlying conductive structures 110 and 114. Opening 302, 304 can be formed by etching or other suitable means for removing the desired portions of passivation layer 202.

FIG. 4 illustrates, in a cross-sectional view, semiconductor structure 100 after a barrier layer 402 is conformally deposited over passivation layer 202 and in openings 302, 304.

FIG. 5 illustrates, in a cross-sectional view, semiconductor structure 100 after a conductive layer 502 is formed over the barrier layer 402. Conductive layer 502 can be formed of aluminum, an aluminum copper alloy, or other suitable conductive material or combination of materials.

FIG. 6 illustrates, in a cross-sectional view, semiconductor structure 100 after formation of a patterned masking layer 602 over conductive layer 502 with openings 604, 606 that extend to conductive layer 502. In the example shown, openings 604, 606 are positioned above and to the outside of conductive structures 110, 112, 114 but may be positioned in other suitable locations.

Figure 7:
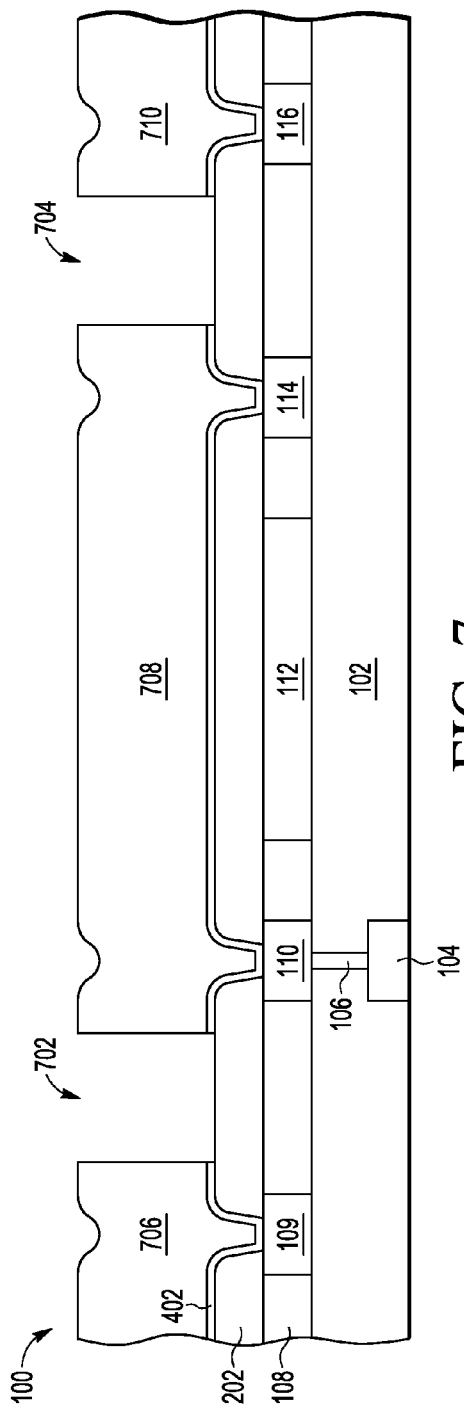
FIG. 7 illustrates a cross-sectional view of the semiconductor structure of FIG. 6 at a subsequent stage of processing in accordance with an embodiment of the present invention.

FIG. 7 illustrates, in a cross-sectional view, semiconductor structure 100 after etching openings 702, 704 in conductive layer 502 under openings 604, 606 (FIG. 6) and removing masking layer 602. Openings 702, 704 extend completely through conductive layer 502 and barrier layer 402 to expose a portion of an upper surface of passivation layer 202, resulting in bond pads 706, 708, 710 formed from conductive layer 502. Opening 702 is positioned between sidewalls of bond pad 706 and 708 and opening 704 is positioned between sidewalls of bond pad 708 and 710.

Figure 8:
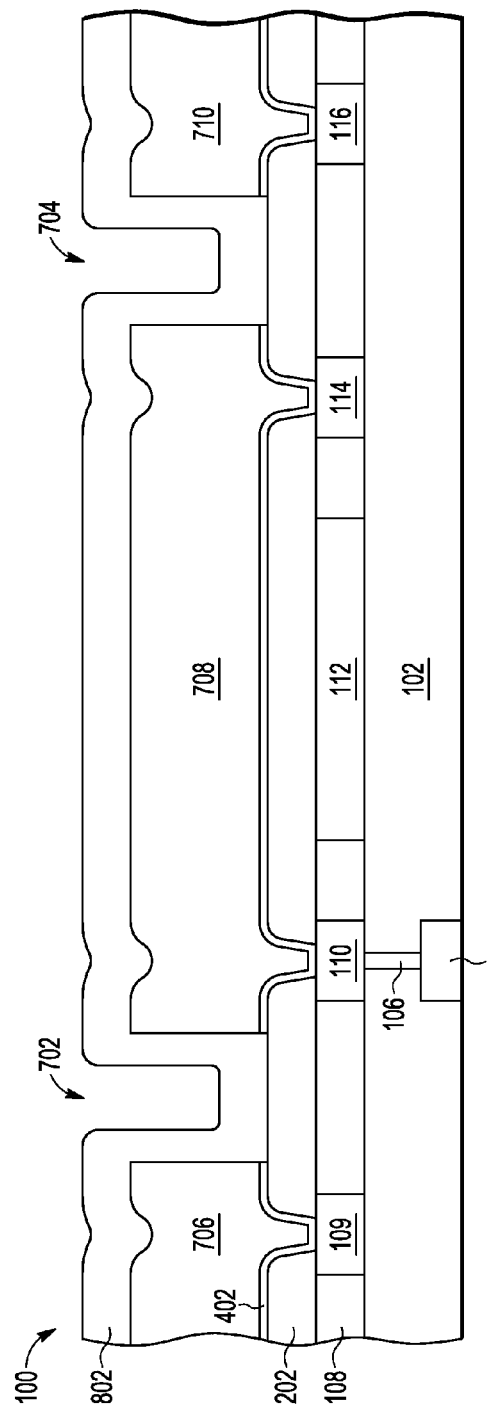
FIG. 8 illustrates a cross-sectional view of the semiconductor structure of FIG. 7 at a subsequent stage of processing in accordance with an embodiment of the present invention.

FIG. 8 illustrates, in cross-sectional view, semiconductor structure 100 after formation of a conformal passivation layer 802 over bond pads 706, 708, 710. The thickness of passivation layer 802 is approximately the same in openings 702, 704 and over the upper surface and sidewalls of bond pads 706, 708, 710.

Figure 9:
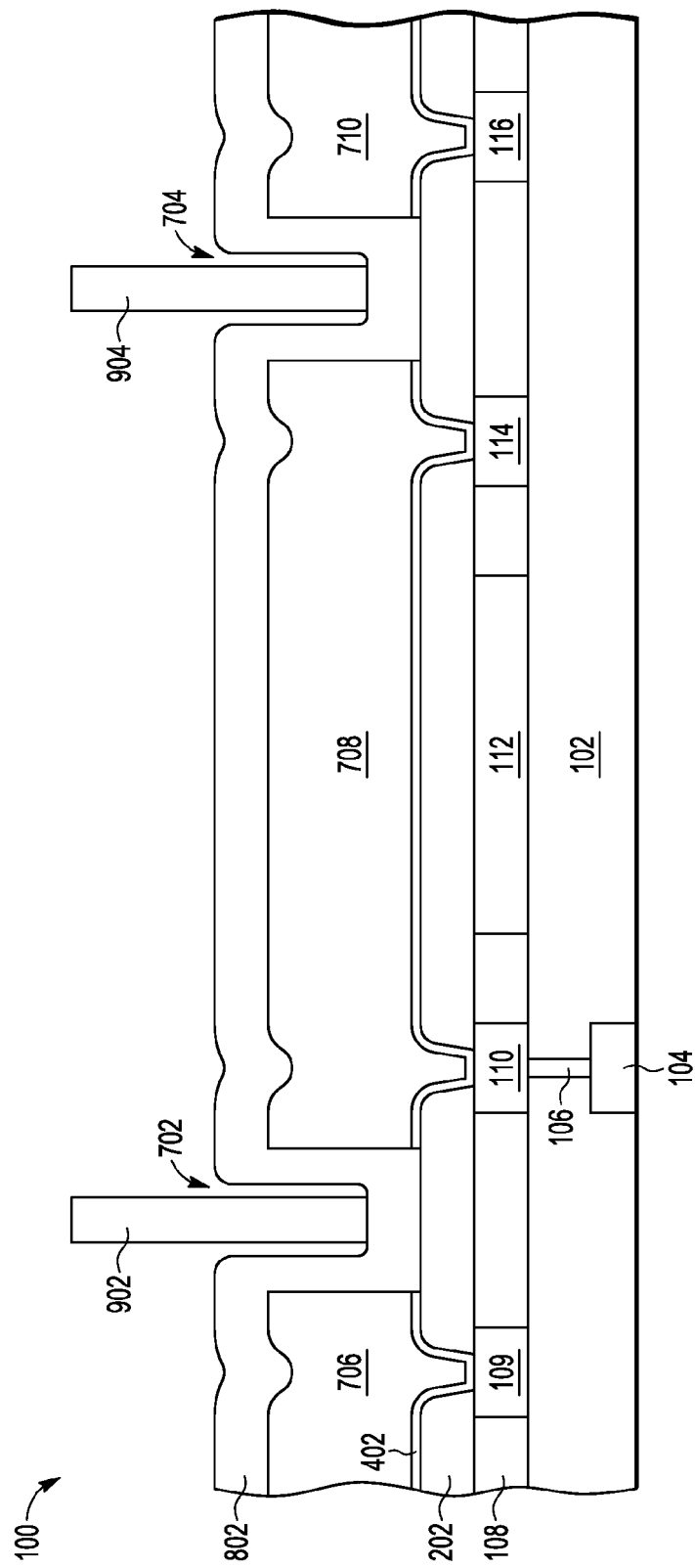
FIG. 9 illustrates a cross-sectional view of the semiconductor structure of FIG. 8 at a subsequent stage of processing in accordance with an embodiment of the present invention.

FIG. 9 illustrates, in cross-sectional view, semiconductor structure 100 after masking pillars 902, 904 are formed over a portion of passivation layer 802 in respective openings 702, 704. Masking pillars 902, 904 typically do not completely fill openings 702, 704, leaving space between the sidewalls of pillars 902, 904 and the sidewalls of passivation layer 802.

Figure 10:
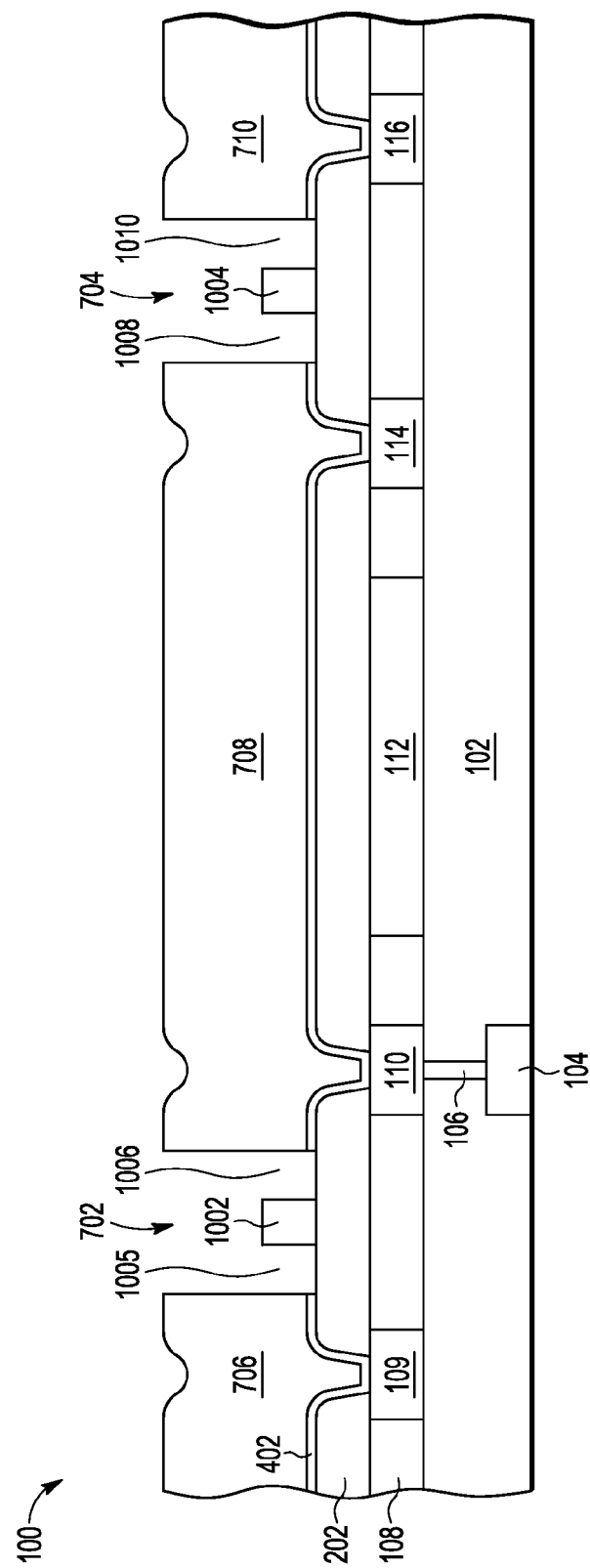
FIG. 10 illustrates a cross-sectional view of the semiconductor structure of FIG. 9 at a subsequent stage of processing in accordance with an embodiment of the present invention.

FIG. 10 illustrates, in cross-sectional view, semiconductor structure 100 after unmasked portions of passivation layer 802 are removed while masked portions of passivation layer 1002, 1004 remain in openings 702, 704. A first gap 1005 is positioned between passivation layer portion 1002 and a sidewall of bond pad 706, a second gap 1006 is positioned between passivation layer portion 1002 and a sidewall of bond pad 708, a third gap 1008 is positioned between passivation layer portion 1004 and a sidewall of bond pad 708, and a fourth gap 1010 is positioned between passivation layer portion 1004 and a sidewall of bond pad 710.

Figure 11:
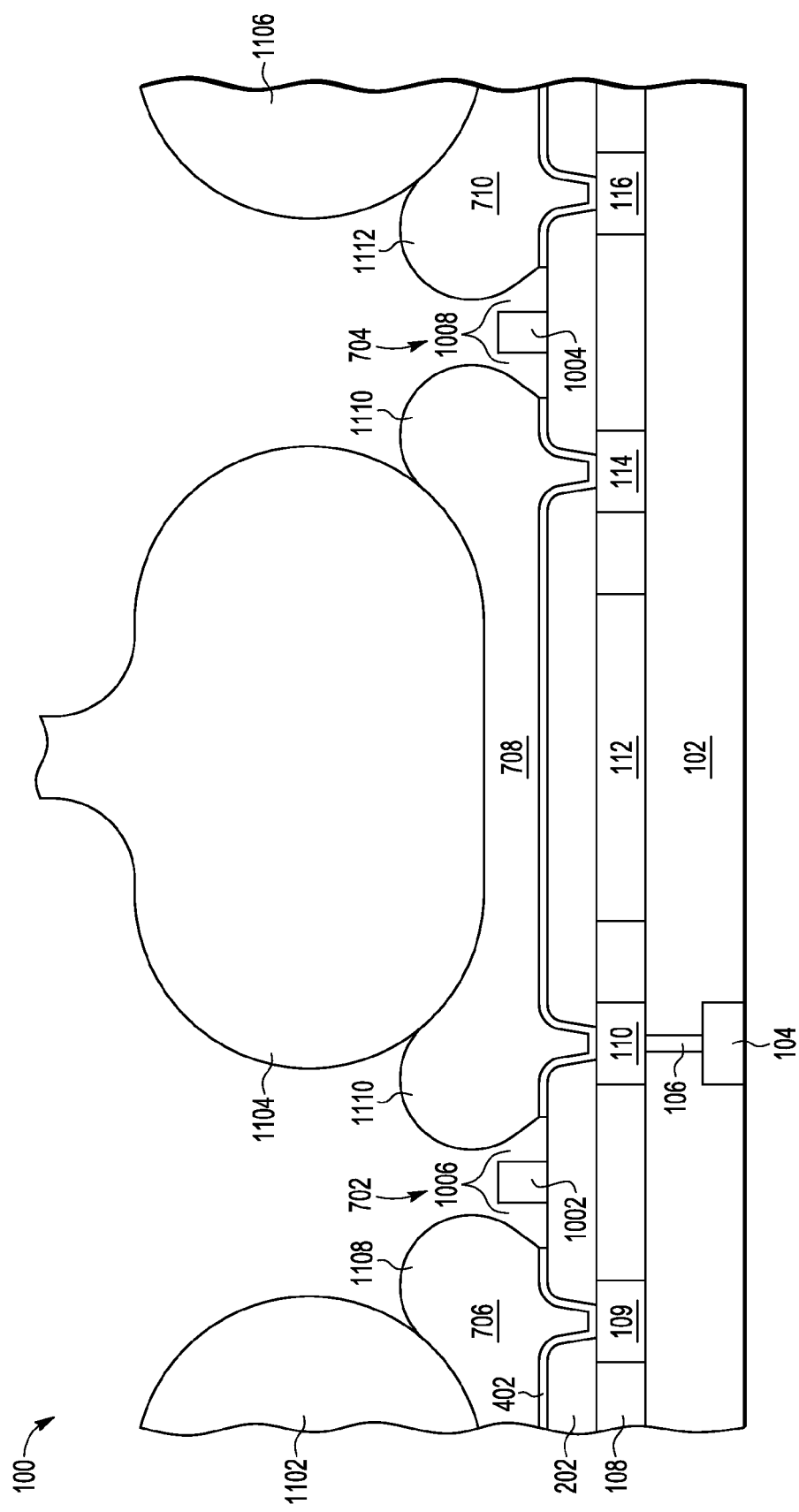
FIG. 11 illustrates a cross-sectional view of the semiconductor structure of FIG. 10 at a subsequent stage of processing in accordance with an embodiment of the present invention.

FIG. 11 illustrates, in a cross-sectional view, semiconductor structure 100 after wire bond connections 1102, 1104, 1106 are formed on respective bond pads 706, 708, 710. Each wire bond connection 1102, 1104, 1106 includes a ball bond that is attached to a wire bond region of a corresponding bond pad 706, 708, 710. Note that upon attaching the wire bonds 1102, 1104, 1106 to the bond pads 706, 708, 710, a respective splash 1108, 1110, 1112 results. In the case of aluminum bond pads, these may be referred to as aluminum splashes. For example, splash 1110 is formed due to the deformation of bond pad 708 that occurs during attachment of wire bond 1104 and is formed in the direction of the ultrasonic vibration of the wire bonder's transducer. Similarly, splashes 1108 and 1112 are formed due to the deformation of respective bond pads 706, 710 that occurs during attachment of ball bonds 1102 and 1106 and are formed in the direction of the ultrasonic vibration of the wire bonder's transducer. In one embodiment, note that a material used to form the wire bonds 1102, 1104, 1106 is harder (e.g. twice as hard) than a material used to form the bond pads 706, 708, 710. For example, in one embodiment, the wire bonds 1102, 1104, 1106 are copper and the bond pads 706, 708, 710 are aluminum.

Note that splashes 1108, 1110, 1112 expand into respective gaps 1006, 1008. Therefore, note that gaps 1006, 1008 may be positioned and sized to contain at least a portion of respective splashes 1108, 1110, 1112. In one embodiment, the gap 1006, 1008 between each bond pad 706, 708, 710 may have a volume large enough to minimize the possibility of the splash unintentionally contacting another conductive structure. Note also that wire bonds 1102, 1104, 1106 experience deformation during attachment to bond pads 706, 708, 710.

Figure 12:
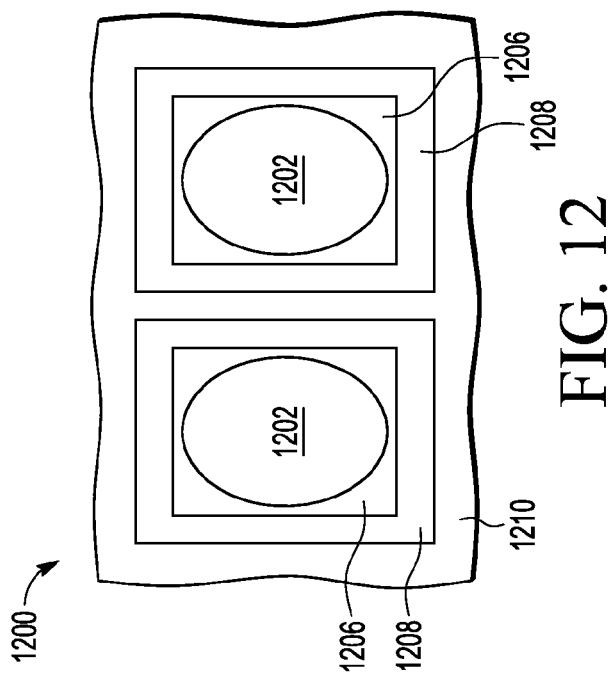
FIG. 12 illustrates a cross-sectional view of the semiconductor structure of FIG. 11 at a subsequent stage of processing in accordance with an embodiment of the present invention.

FIG. 12 illustrates a top down view of two wire bonds 1202, bond pads 1206, gaps 1208, and passivation layer 1210 of semiconductor structure 1200 in accordance with one embodiment of the present invention. The entire outer perimeter of each bond pad 1206 is surrounded by gap 1208. Passivation layer 1210 surrounds the entire outer perimeter of gap 1208. As can be seen in the embodiment of FIG. 12, gaps 1208 are formed between the perimeter of the bond pads 1206 and the passivation layer 1210. Also, gaps 1208 are continuous around bond pads 1206.

Figure 13:
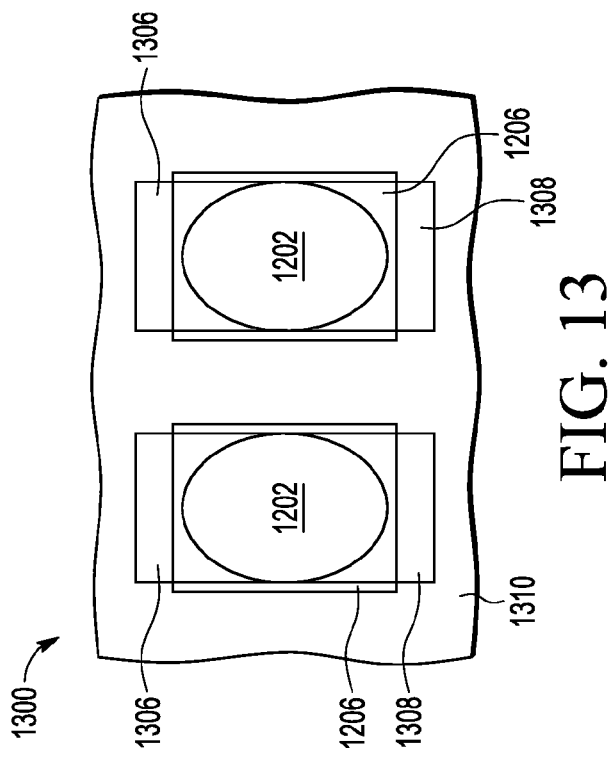
FIG. 13 illustrates a top-down view of a semiconductor structure in accordance with another embodiment of the present invention.

FIG. 13 illustrates a top down view of two wire bonds 1202, bond pads 1206, passivation layer 1310 of semiconductor structure 1300 in accordance with another embodiment of the present invention in which in place of a continuous gap 1208 (FIG. 12), two gaps 1306, 1308 are formed at opposite ends of bond pads 1206. That is, rather than having a single continuous gap, multiple gaps 1306, 1308 may be used and positioned where the splash is formed. For example, gaps 1306, 1308 may be positioned in accordance with the direction of ultrasonic vibration of the wire bonder's transducer. That is, the splashes may be formed in the direction of the vibration, therefore, gaps 1306, 1308 may be formed in the direction of the vibration in order to capture the splash. Also, note that gaps 1306, 1308 may have difference shapes. For example, they may be curved in shape rather than rectangular.

Figure 14:
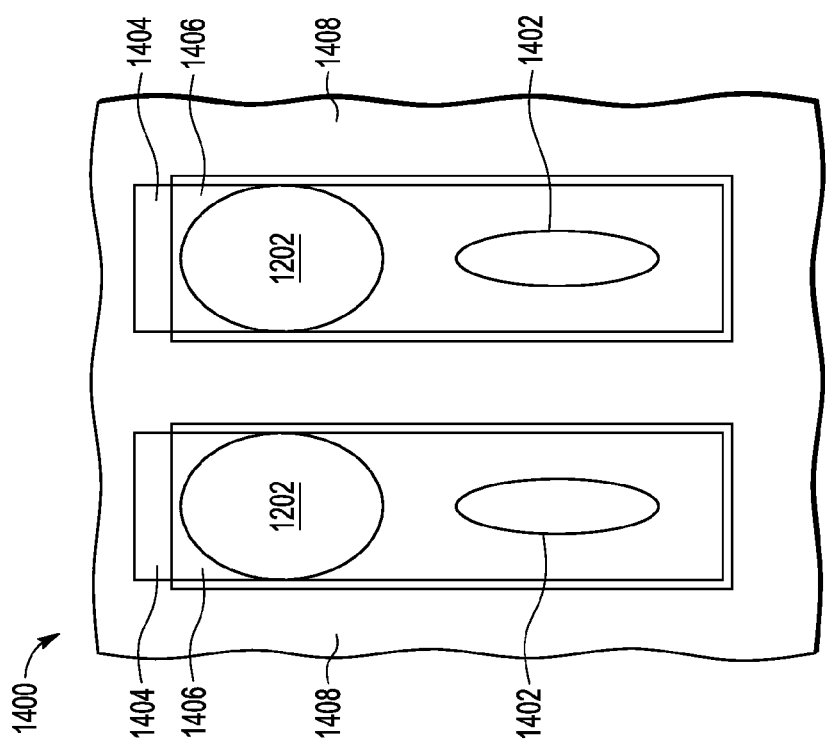
FIG. 14 illustrates a top-down view of a semiconductor structure in accordance with another embodiment of the present invention.

FIG. 14 illustrates a top down view of two wire bonds 1202, bond pads 1406, test probe regions 1402, rectangular gaps 1404, and passivation layer 1408 of semiconductor structure 1400 in accordance with another embodiment of the present invention. Test probe regions 1402 are positioned on one side of wire bonds 1202 on bond pads 1406 and gaps 1404 are positioned at a top edge of bond pads 1406 on another side of wire bonds 1202. Gaps 1404 may be positioned in accordance with the direction of ultrasonic vibration of the wire bonder's transducer. That is, the splashes may be formed in the direction of the vibration, therefore, gaps 1404 may be formed in the direction of the vibration in order to capture the splash. With test probe regions 1402 included on bond pads 1406, any splash in a direction opposite the position of gaps 1404 may be absorbed in bond pads 1406. Also, note that gaps 1404 may have difference shapes. For example, they may be curved in shape rather than rectangular.

Figure 15:
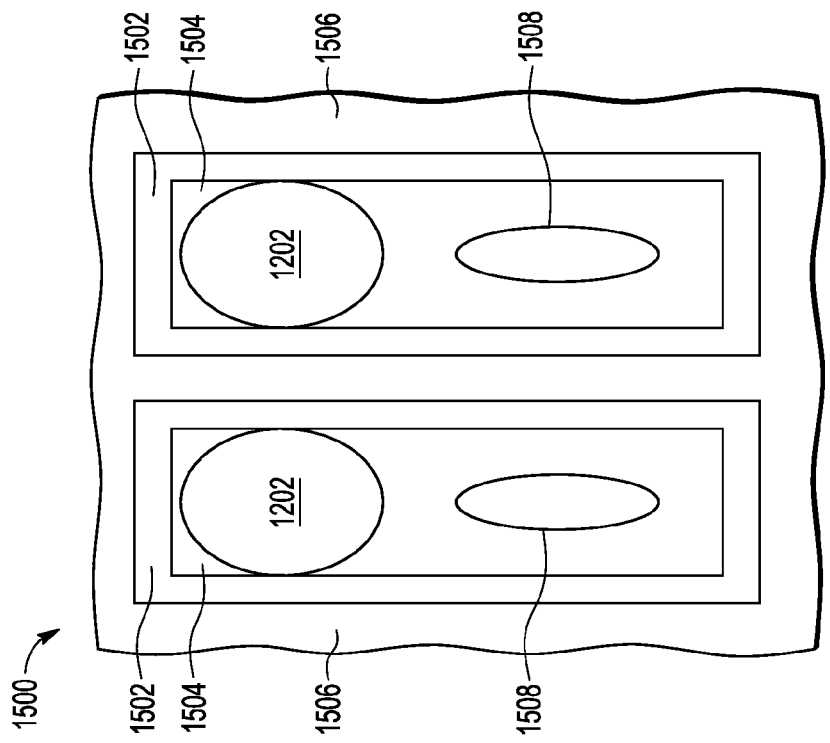
FIG. 15 illustrates a top-down view of a semiconductor structure in accordance with another embodiment of the present invention.

FIG. 15 illustrates a top down view of two wire bonds 1202, bond pads 1504, gaps 1502, test probe regions 1508, and passivation layer 1506 of semiconductor structure 1500 in accordance with another embodiment of the present invention. The entire outer perimeter of each bond pad 1504 is surrounded by respective gap 1502. Passivation layer 1506 surrounds the entire outer perimeter of gap 1502. As can be seen in the embodiment of FIG. 15, gaps 1502 are formed between the perimeter of the bond pads 1504 and the passivation layer 1506. Also, gaps 1502 are continuous around bond pads 1504 to absorb any splash that forms during the wire bonding process.

FIG. 16 illustrates a top down view of two wire bonds 1602, bond pads 1606, gaps 1607, 1608, test probe regions 1604, and passivation layer 1610 of semiconductor structure 1600 in accordance with another embodiment of the present invention. Bond pads 1606 are rectangular with a long side and a short side. Test probe regions 1604 are positioned on one side of wire bonds 1602 along the long side bond pads 1606. Gaps 1607, 1608 are positioned on either side of wire bonds 1602 around a portion of the perimeter of bond pad 1606 along the long side of bond pads 1606. Gaps 1607, 1608 may be positioned in accordance with the direction of ultrasonic vibration of the wire bonder's transducer. That is, the splashes may be formed in the direction of the vibration, therefore, gaps 1607, 1608 may be formed in the direction of the vibration in order to capture the splash. Note that gaps 1607, 1608 may have difference shapes. For example, they may be curved in shape rather than rectangular.

FIGS. 17 and 18 illustrate an overview of an example wire bonding sequence for bonding a copper wire bond to an aluminum bond pad. As shown in FIG. 17, the bonding process begins with a threaded capillary 1726 that is positioned above bond pad 1721 formed on a semiconductor structure 1720. In particular, capillary 1726 is threaded with a copper wire conductor with free air ball 1722. In an example sequence, a copper wire conductor is inserted or threaded through a central opening in the capillary having a specified hole diameter, followed by formation of a free air ball 1722 at the end of the wire conductor, such as by using an electrical flame off (EFO) process to form a free air ball. In capillary 1726, the free air ball portion is captured in the capillary's chamfer portion having a specified chamfer diameter.

As shown in FIG. 18, capillary 1726 with copper wire conductor and free air ball 1722 descends or moves down to the wire bond region (which may also be referred to as the bond site) on bond pad 1721. By applying downward force from capillary 1726 to bond pad 1721 and structure 1720, the free air ball 1722 is deformed to form a squashed ball bond.

After the free air ball 1722 is in contact with the bond pad 1721, the ball bonding process may include a specified combination of heat, pressure and ultrasonic energy to form an intermetallic connection or weld between ball bond 1722 and bond pad 1721. During this process, splashes 1725 are formed. However, gap 1719 operates to contain at least a portion of the splash 1725. By forming gap 1719 at or beyond an expected outer edge of a capillary chamfer region of bond ball 1722, gap 1719 may be positioned to contain a sufficient amount of the splash. In this manner, passivation cracking may be reduced which typically occurs with the splashes when gap 1719 is not present.

By now it should be appreciated that there has been provided a bond pad and passivation layer with gaps sized and positioned to capture at least a portion of any splashes formed during the wire bond process. Each bond pad may include a single gap or a plurality of gaps. In this manner, passivation cracking between the bond pads may be reduced, thus increasing yield.

In some embodiments, a method can comprise forming a wire bond pad [502] of an integrated circuit [100], and forming a first gap [1006, 1008] between a first selected portion of the wire bond pad [502] and a passivation material [802]. The first gap [1006, 1008] is positioned to contain at least a first portion of a splash [1108, 1110, 1112, 1114] of the wire bond pad [502], the splash formed during a wire bond process.

In another aspect, the first gap can surround the selected portion of the wire bond pad.

In another aspect, the wire bond process can comprise using a wire bonder [17xx], the wire bonder having one or more associated vibration directions, and the splash moves in a direction substantially similar to the one or more associated vibration directions.

In another aspect, the one or more associated vibration directions can comprise one or more associated ultrasonic vibration directions.

In another aspect, the first gap can be positioned to contain at least the first portion of the splash in one of the one or more associated vibration directions.

In another aspect, the method can further comprise forming a second gap [1008] between a second selected portion of the wire bond pad [502] and a passivation material [802], the second gap positioned to contain at least a second portion of the splash of the wire bond bad.

In another aspect, the wire bond process can comprise using a wire bonder [1726], the wire bonder having one or more associated vibration directions, and the splash moves in a direction substantially similar to the one or more associated vibration directions.

In another aspect, the first gap can be positioned to contain at least the first portion of the splash in one of the one or more associated vibration directions.

In another aspect, the second gap can be positioned to contain at least the second portion of the splash in another of the one or more associated vibration directions.

In another aspect, the wire bond pad can include a probe region [1402, 1508, 1604].

In another embodiment, a semiconductor device can comprise an integrated circuit [100] including a wire bond pad [502] and a passivation material [802]. A first gap [1006, 1008] is positioned between a first selected portion of the wire bond pad [502] and the passivation material [802]. The first gap [1006, 1008] is positioned to contain at least a first portion of a splash [1108, 1110, 1112] of the wire bond pad [502] formed during a wire bond process.

In another aspect, the first gap can surround the selected portion of the wire bond pad.

In another aspect, the wire bond process can comprise using a wire bonder, the wire bonder having one or more associated vibration directions [17xx], and the splash moves in a direction substantially similar to the one or more associated vibration directions.

In another aspect, the one or more associated vibration directions can comprise one or more associated ultrasonic vibration directions.

In another aspect, the first gap can be positioned to contain at least the first portion of the splash in one of the one or more associated vibration directions.

In another aspect, the device can further comprise forming a second gap [1008] between a second selected portion of the wire bond pad [502] and a passivation material [802], the second gap can be positioned to contain at least a second portion of the splash of the wire bond bad.

In another aspect, the wire bond process can comprise using a wire bonder, the wire bonder having one or more associated vibration directions, and the splash moves in a direction substantially similar to the one or more associated vibration directions.

In another aspect, the first gap can be positioned to contain at least the first portion of the splash in one of the one or more associated vibration directions.

In another aspect, the second gap can be positioned to contain at least the second portion of the splash in another of the one or more associated vibration directions.

In another aspect, the wire bond pad can include a probe region [1402, 1508, 1604].

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the gaps may have different configurations and shapes, as needed, to contain or reduce the splashes. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, the method comprising:
   forming a wire bond pad of an integrated circuit; and
   forming a first gap between a first selected portion of the wire bond pad and a passivation material, the first gap positioned to contain at least a first portion of a splash of the wire bond pad, the splash formed during a wire bond process.

2. The method of claim 1 wherein the first gap surrounds the selected portion of the wire bond pad.

3. The method of claim 1 wherein the wire bond process comprises using a wire bonder, the wire bonder having one or more associated vibration directions, and the splash moves in a direction substantially similar to the one or more associated vibration directions.

4. The method of claim 3 wherein the one or more associated vibration directions comprise one or more associated ultrasonic vibration directions.

5. The method of claim 3 wherein the first gap is positioned to contain at least the first portion of the splash in one of the one or more associated vibration directions.

6. The method of claim 1, further comprising forming a second gap between a second selected portion of the wire bond pad and a passivation material, the second gap positioned to contain at least a second portion of the splash of the wire bond bad.

7. The method of claim 6 wherein the wire bond process comprises using a wire bonder, the wire bonder having one or more associated vibration directions, and the splash moves in a direction substantially similar to the one or more associated vibration directions.

8. The method of claim 7 wherein the first gap is positioned to contain at least the first portion of the splash in one of the one or more associated vibration directions.

9. The method of claim 8 wherein the second gap is positioned to contain at least the second portion of the splash in another of the one or more associated vibration directions.

10. The method of claim 1 wherein the wire bond pad includes a probe region.

11. A semiconductor device comprising:
    an integrated circuit including a wire bond pad and a passivation material;
    a first gap between a first selected portion of the wire bond pad and the passivation material, the first gap positioned to contain at least a first portion of a splash of the wire bond pad, the splash formed during a wire bond process.

12. The semiconductor device of claim 11 wherein the first gap surrounds the selected portion of the wire bond pad.

13. The semiconductor device of claim 11 wherein the wire bond process comprises using a wire bonder, the wire bonder having one or more associated vibration directions, and the splash moves in a direction substantially similar to the one or more associated vibration directions.

14. The semiconductor device of claim 13 wherein the one or more associated vibration directions comprise one or more associated ultrasonic vibration directions.

15. The semiconductor device of claim 13 wherein the first gap is positioned to contain at least the first portion of the splash in one of the one or more associated vibration directions.

16. The semiconductor device of claim 11, further comprising forming a second gap between a second selected portion of the wire bond pad and a passivation material, the second gap positioned to contain at least a second portion of the splash of the wire bond pad.

17. The semiconductor device of claim 16 wherein the wire bond process comprises using a wire bonder, the wire bonder having one or more associated vibration directions, and the splash moves in a direction substantially similar to the one or more associated vibration directions.

18. The semiconductor device of claim 17 wherein the first gap is positioned to contain at least the first portion of the splash in one of the one or more associated vibration directions.

19. The semiconductor device of claim 18 wherein the second gap is positioned to contain at least the second portion of the splash in another of the one or more associated vibration directions.

20. The semiconductor device of claim 11 wherein the wire bond pad includes a probe region.

* * * * *